(12) United States Patent
Holmes et al.

(10) Patent No.: US 8,715,917 B2
(45) Date of Patent: May 6, 2014

(54) SIMULTANEOUS PHOTORESIST DEVELOPMENT AND NEUTRAL POLYMER LAYER FORMATION

(71) Applicant: International Business Machines Corporation, Armonk, NY (US)

(72) Inventors: Steven J. Holmes, Guilderland, NY (US); Jassem Ahmed Abdallah, Albany, NY (US); Joy Cheng, San Jose, CA (US); Matthew E. Colburn, Schenectady, NY (US); Chi-chun Liu, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 13/644,683

(22) Filed: Oct. 4, 2012

(65) Prior Publication Data

US 2014/0099583 A1 Apr. 10, 2014

(51) Int. Cl.
*G03F 7/26* (2006.01)

(52) U.S. Cl.
USPC .......................................................... 430/325

(58) Field of Classification Search
USPC ................................................. 430/322, 325
See application file for complete search history.

(56) References Cited

U.S. PATENT DOCUMENTS

| 7,470,954 | B2 | 12/2008 | Lee et al. |
| 7,790,350 | B2 | 9/2010 | Breyta et al. |
| 8,088,551 | B2 | 1/2012 | Sills et al. |
| 8,114,468 | B2 | 2/2012 | Sandhu et al. |
| 8,129,286 | B2 | 3/2012 | Edelstein et al. |
| 8,133,534 | B2 | 3/2012 | Stoykovich et al. |
| 2009/0019171 | A1 | 1/2009 | Liu et al. |
| 2010/0012462 | A1 | 1/2010 | Cerf |
| 2010/0016721 | A1 | 1/2010 | Kanai et al. |
| 2010/0151393 | A1 | 6/2010 | Kim et al. |
| 2010/0167214 | A1 | 7/2010 | Yoon et al. |

FOREIGN PATENT DOCUMENTS

KR 20100080336 7/2010

OTHER PUBLICATIONS

Jin, H.M. et al., "Ultralarge-Area Block Copolymer Lithography Using Self-Assembly Assisted Photoresist Pre-Pattern" 2011 IEEE Nanotechnology Materials and Devices Conference (Oct. 18-21, 2011) pp. 527-533.

*Primary Examiner* — Brittany Raymond
(74) *Attorney, Agent, or Firm* — Scully, Scott, Murphy & Presser, P.C.; H. Daniel Schnurmann

(57) ABSTRACT

A photoresist layer is lithographically exposed to form lithographically exposed photoresist regions and lithographically unexposed photoresist regions. The photoresist layer is developed with a non-polar or weakly polar solvent including a dissolved neutral polymer material. A neutral polymer layer is selectively formed on physically exposed surfaces of a hard mask layer underlying the photoresist layer. The neutral polymer layer has a pattern corresponding to the complement of the area of remaining portions of the photoresist layer. The remaining portions of the photoresist layer are then removed with a polar solvent without removing the neutral polymer layer on the hard mask layer. A block copolymer material can be subsequently applied over the neutral polymer, and the neutral polymer layer can guide the alignment of a phase-separated block copolymer material in a directed self-assembly.

20 Claims, 9 Drawing Sheets

SIMULTANEOUS PHOTORESIST DEVELOPMENT AND NEUTRAL POLYMER LAYER FORMATION

BACKGROUND

The present disclosure relates generally to a method for directed self-assembly of block copolymers, and more particularly to a method of simultaneously development of a photoresist and formation of a neutral polymer layer for directed self-assembly of block copolymers.

As integrated circuit densities have scaled, the use of grating based patterning techniques and unidirectional design has become an integral part of pattern formation technology. Grating fabrication can be effected using a variety of techniques including direct self-assembly, sidewall image transfer, pitch split lithography, extreme ultraviolet lithography, electron beam lithography, and interference lithography.

Directed self-assembly is a technique for forming a sub-lithographic line/space pattern utilizing the phase separation of a block copolymer thin film. The resolution and the critical dimension (CD) of the pattern are controlled by the composition of the copolymer. The methods of aligning the phase separated copolymers include chemical epitaxy and graphoepitaxy. The advantages of direct self-assembly include a high resolution of features at dimensions less than 10 nm, compatibility with existing lithography techniques, and the ability for frequency multiplication and space subdivision.

However, directed self-assembly processing adds complexity, added cost, and defectivity concerns to semiconductor manufacturing. Thus, a method for performing directed self-assembly with a minimal number of processing steps is desired.

SUMMARY

A photoresist layer is lithographically exposed to form lithographically exposed photoresist regions and lithographically unexposed photoresist regions. The photoresist layer is developed with a non-polar or weakly polar solvent including a dissolved neutral polymer material therein. A neutral polymer layer is selectively formed on physically exposed surfaces of a hard mask layer underlying the photoresist layer. The neutral polymer layer has a pattern corresponding to the complement of the area of remaining portions of the photoresist layer. The remaining portions of the photoresist layer are then removed with a polar solvent without removing the neutral polymer layer on the hard mask layer. A block copolymer material can be subsequently applied over the neutral polymer, and the neutral polymer layer can guide the alignment of a phase-separated block copolymer material in a directed self-assembly.

According to an aspect of the present disclosure, a method of forming a patterned structure is provided. A photoresist layer is formed on a hard mask layer. The photoresist layer is lithographically exposed to form at least one lithographically exposed photoresist portion and at least one lithographically unexposed photoresist portion therein. The photoresist layer is developed with a non-polar or weakly polar solvent including a dissolved neutral polymer material therein. The at least one lithographically exposed photoresist portion or the at least one lithographically unexposed photoresist portion is removed from above the hard mask layer. A neutral polymer layer including the neutral polymer material is formed on physically exposed surfaces of the hard mask layer. Remaining portions of the photoresist layer are removed from above the hard mask layer selective to the neutral polymer layer.

DETAILED DESCRIPTION

Figure 1A:
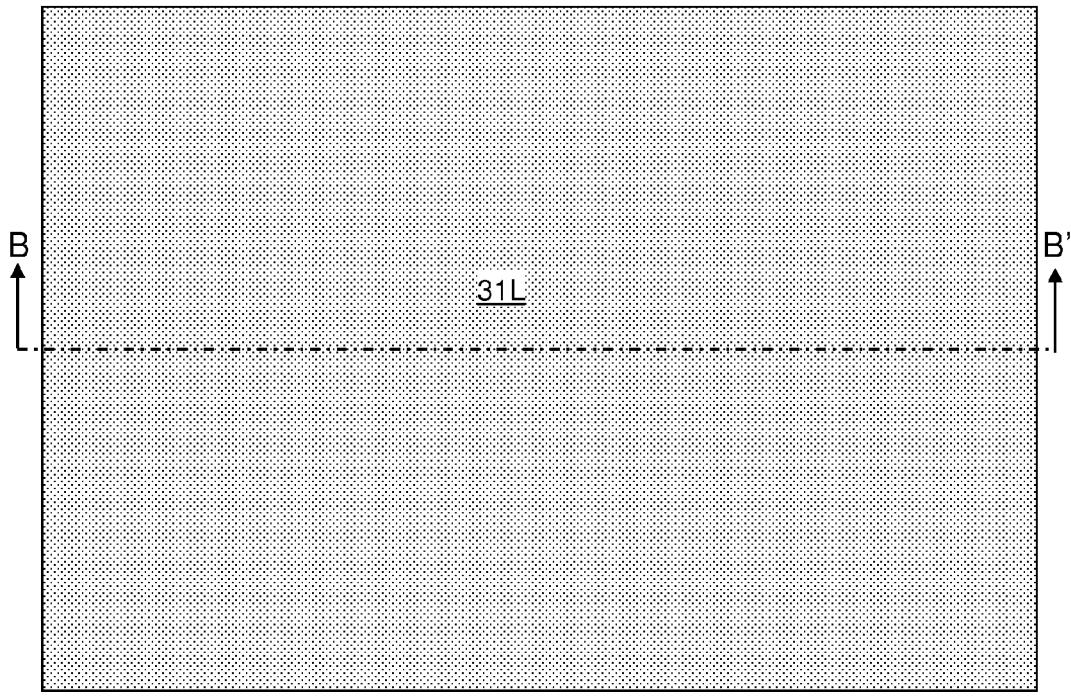
FIG. 1A is a top-down view of an exemplary structure after formation of a material layer, an optically planarizing layer (OPL), and a hard mask layer according to an embodiment of the present disclosure.

As stated above, the present disclosure relates to a method of simultaneously development of a photoresist and formation of a neutral polymer layer for directed self-assembly of block copolymers. Aspects of the method are now described in detail with accompanying figures. It is noted that like and corresponding elements are referred to by like reference numerals.

Figure 1B:
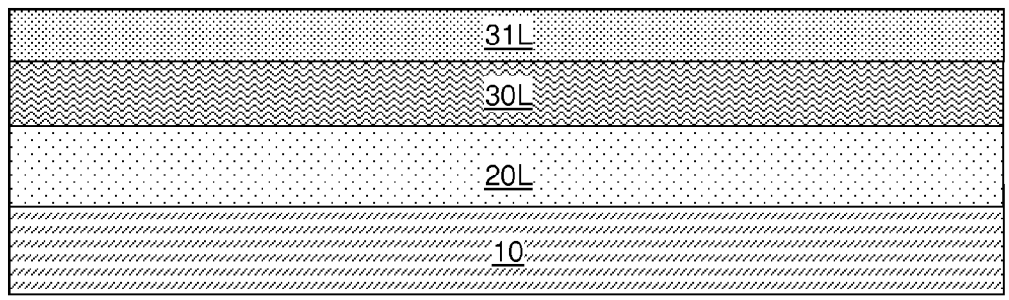
FIG. 1B is a vertical cross-sectional view of the exemplary patterned structure along the vertical plane B-B' of FIG. 1A.

Referring to FIGS. 1A and 1B, an exemplary structure according to an embodiment of the present disclosure includes a stack, from bottom to top, of a substrate 10, a material layer 20L, an optically planarizing layer (OPL) 30L, and a hard mask layer 31L.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include a metal interconnect structure including at least one dielectric material layer and metal lines and/or metal via structures embedded therein. The top surface of the substrate 10 can be planar, or can have a non-planar topography.

The material layer 20L can be a permanent material layer that is intended to remain at the end of a sequence of processing steps, or a temporary material layer that is intended to be removed after the sequence of processing steps. In one embodiment, the material layer 20L can be a conductive material layer, a dielectric material layer, a semiconductor material layer, or a stack thereof. In one embodiment, the material layer 20L can be a dielectric hard mask layer such as a silicon nitride layer or a silicon oxide layer. The thickness of the material layer 20L can be from 5 nm to 100 nm, although lesser and greater thicknesses can also be employed. The top surface of the material layer 20L can be planar, or can have a non-planar topography.

The OPL 30L includes a self-planarizing material. As used herein, a self-planarizing material is a material that flows at the standard ambient temperature and pressure (SATP), i.e., 20° C. (293.15 K, 68° F.) and an absolute pressure of 101.325 kPa (14.696 psi, 1 atm), to provide a planar top surface. In one embodiment, the self-planarizing material of the OPL 30L can be an organic material including C, O, and H, and optionally including Si and/or F. In another embodiment, the self-planarizing material of the OPL 30L can be amorphous carbon. The formulation of the OPL 30L can be selected to provide sufficiently low viscosity so that a top surface of the OPL is self-planarizing over underlying topographic features. In one embodiment, the self-planarizing material of the underlying OPL 20 can be an amorphous carbon layer. The thickness of the OPL 30L can be from 10 nm to 300 nm, although lesser and greater thicknesses can also be employed.

The hard mask layer 31L is formed on top of the OPL 30L. The hard mask layer 31L includes a hard mask material such as silicon oxide, silicon nitride, silicon oxynitride, a silicon-based anti-reflective coating (ARC) material as known in the art, or combinations thereof. The hard mask layer 31L can be formed, for example, by chemical vapor deposition (CVD), atomic layer deposition (ALD), or spin-coating. The thickness of the hard mask layer 31L can be from 1 nm to 20 nm, although lesser and greater thicknesses can also be formed. The hard mask layer 31L can be employed to reduce structural or compositional damage to the OPL 30L during removal of polymeric component portions at a subsequent processing step.

Figure 2A:
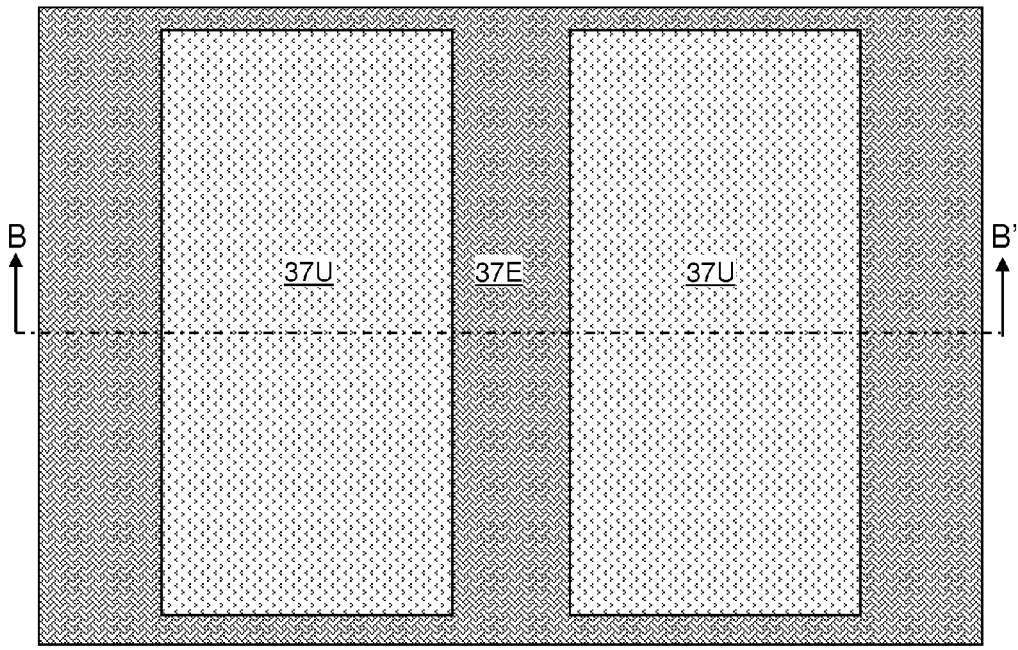
FIG. 2A is a top-down view of the exemplary patterned structure after lithographic exposure of the photoresist layer including a negative tone photoresist material according to an embodiment of the present disclosure.
Figure 2B:
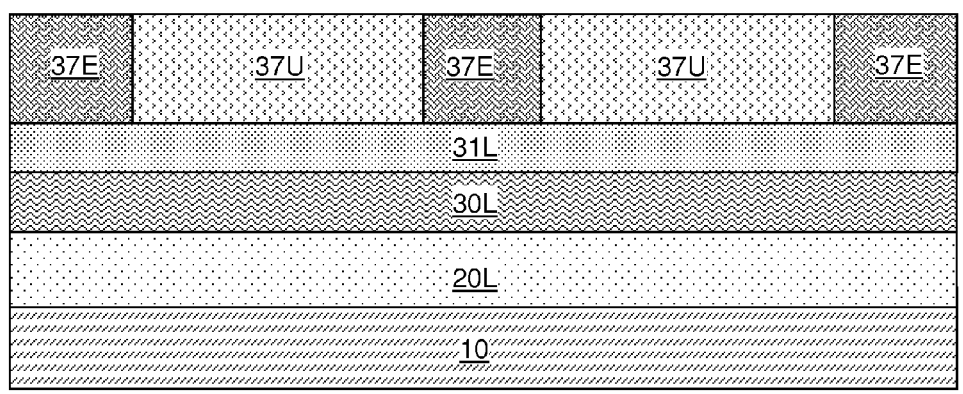
FIG. 2B is a vertical cross-sectional view of the exemplary patterned structure along the vertical plane B-B' of FIG. 2A.

Referring to FIGS. 2A and 2B, a photoresist layer is applied directly on the top surface of the hard mask layer 31L and is lithographically patterned. In one embodiment, the photoresist layer can include a negative tone photoresist material. The negative tone photoresist material can be selected from materials that dissolve in a non-polar solvent or in a weakly polar solvent. As used herein, a "non-polar solvent" refers to a solvent with a dielectric constant less than 15. As used herein, a "weakly polar solvent" refers to a solvent with a dielectric constant not less than 15 and not more than 20. Examples of non-polar solvents include of anisole, 2-heptanone, n-butylacetone, isopropanol, pentane, cyclopentane, hexane, cyclohexane, benzene, toluene, 1,4-dioxane, chloroform, diethyl ether, dichloromethane (DCM), tetrahydrofuran (THF), and ethyl acetate. An example of a weakly polar solvent is isopropanol. The thickness of the photoresist layer can be, for example, from 100 nm to 1,000 nm, although lesser and greater thicknesses can also be employed.

The photoresist layer is lithographically exposed to form at least one lithographically exposed photoresist portion 37E and at least one lithographically unexposed photoresist portion 37U therein. The area of the at least one lithographically unexposed photoresist portion 37U can be selected to coincide with the area in which a neutral polymer layer is to be subsequently formed. The neutral polymer layer is used to control the orientation of phase-separated self-assembling block copolymers. In one embodiment, the at least one lithographically unexposed photoresist portion 37U can have a polygonal shape. In one embodiment, the at least one lithographically unexposed photoresist portion 37U can have a rectangular shape.

Figure 3A:
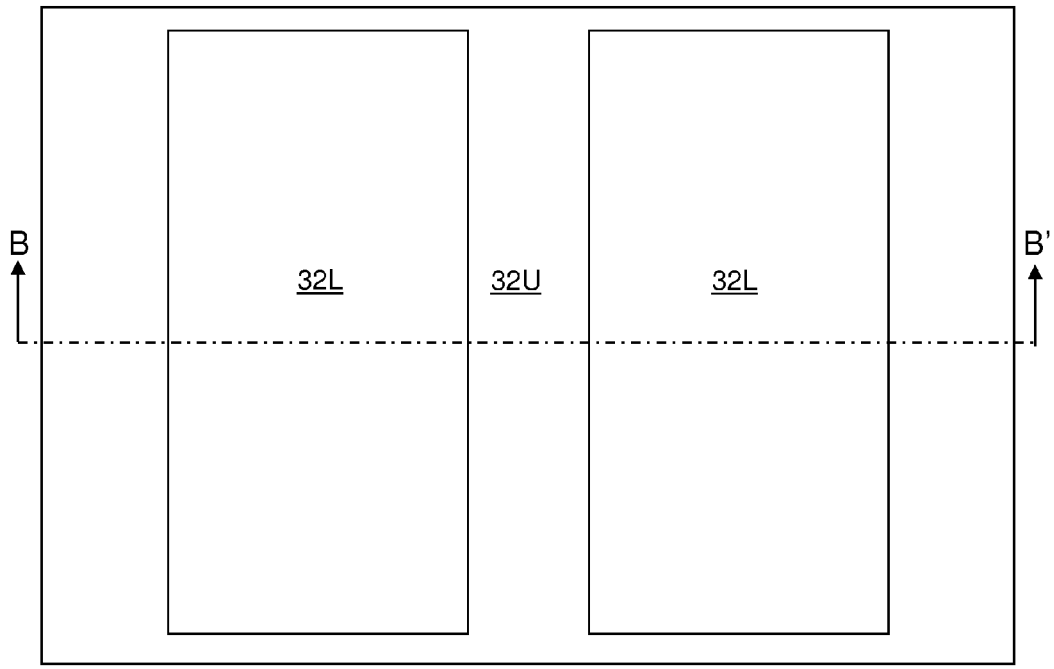
FIG. 3A is a top-down view of the exemplary patterned structure after development of the photoresist layer and simultaneous formation of a neutral polymer layer according to an embodiment of the present disclosure.
Figure 3B:
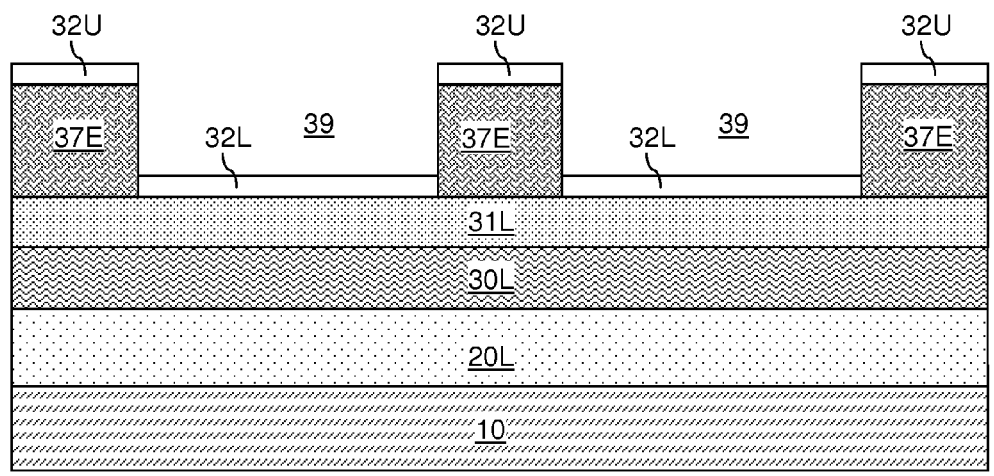
FIG. 3B is a vertical cross-sectional view of the exemplary patterned structure along the vertical plane B-B' of FIG. 3A.

Referring to FIGS. 3A and 3B, a lithographic development of the photoresist layer and formation of a neutral polymer layer can be simultaneously performed. If the photoresist layer includes a negative tone photoresist material, the simultaneous lithographic development of the photoresist layer and formation of the neutral polymer layer can be formed, for example, employing a non-polar or weakly polar solvent. A random polymer material is dissolved in the non-polar or weakly polar solvent prior to use for development of the photoresist layer. Subsequently, the non-polar or weakly polar solvent including the random polymer material is applied to the photoresist layer for development of the photoresist layer. The non-polar or weakly polar solvent dissolves the at least one lithographically unexposed photoresist portion 37U selective to the at least one lithographically exposed photoresist portion 37E.

For example, the non-polar or weakly polar solvent can be a non-polar solvent that includes at least one of anisole (having a dielectric constant of 4.33), 2-heptanone (having a dielectric constant of 11.9), and n-butylacetate (having a dielectric constant of 5.1). The neutral polymer material dissolved in the non-polar or weakly polar solvent includes a random polymer material in which at least two types of monomers are polymerized in a random sequence. In one embodiment, the random polymer material can include random sequences of styrene and methyl methacrylate. In addition, the neutral polymer material may include a functional group that binds to the material of the hard mask layer 31L.

Upon removal of the at least one lithographically unexposed photoresist portion 37U from above the hard mask layer 31L, at least one trench 39 is formed in volumes from which the at least one lithographically unexposed photoresist portion 37U is removed. A lower neutral polymer layer 32L including the neutral polymer material is formed on each physically exposed surface of the hard mask layer 31L at the bottom of each trench 39. The thickness of the lower neutral polymer layer 32L can be, for example, from 1 nm to 5 nm. The at least one lithographically exposed photoresist portion 37E remains on the hard mask layer 31L. An upper neutral polymer layer 32U including the neutral polymer material may be formed on the physically exposed horizontal surfaces of the at least one lithographically exposed photoresist portion 37E. The thickness of the upper neutral polymer layer 32U can be, for example, from 1 nm to 5 nm. The sidewalls of the at least one lithographically exposed photoresist portion 37E are not typically covered by a neutral polymer layer because the neutral polymer material tends to flow down the sidewalls of the at least one lithographically exposed photoresist portion 37E before volatile components of the non-polar or weakly polar solvent evaporates.

Optionally, a bake process may be performed on the exemplary structure in order to drive out volatile components of the solvent from the lower neutral polymer layer 32L and the upper neutral polymer layer 32U. In this case, the remaining portions of the photoresist layer, i.e., the at least one lithographically exposed photoresist portion 37E, and the lower neutral polymer layer 32L and the upper neutral polymer layer 32U are simultaneously baked. The bake process can be performed at an elevated temperature, which can be in a range from 80 C to 200 C, although lesser and greater temperatures can also be employed.

Optionally, an additional neutral polymer material can be added to the lower and/or upper neutral polymer layers (32L, 32U). The additional neutral polymer material can be added, for example, by spin coating of the same random polymer material present in the lower and/or upper neutral polymer layers (32L, 32U) prior to application of the additional neutral polymer, or may be added by spin coating of a different random polymer material. In this case, the bake process may be performed prior to the application of the additional neutral polymer layer. The thicknesses of the lower and/or upper neutral polymer layers (32L, 32U) may be in a range from 1.5 nm to 5 nm, although lesser and greater thicknesses can also be employed.

Figure 4A:
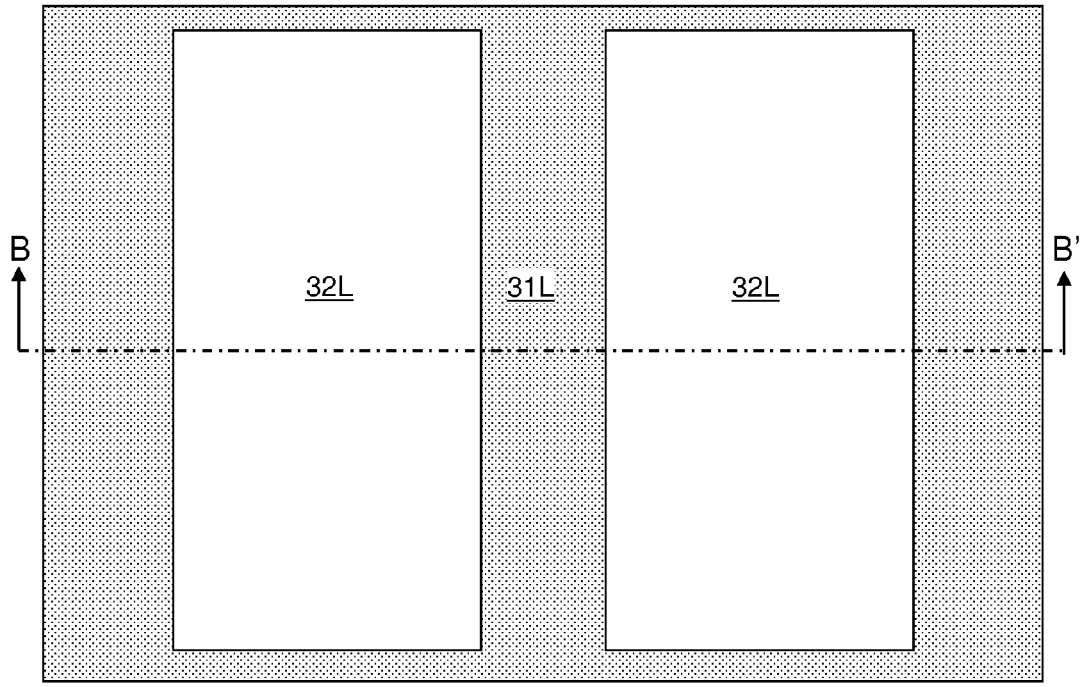
FIG. 4A is a top-down view of the exemplary patterned structure after removal of remaining portions of the photoresist layer selective to the neutral polymer layer according to an embodiment of the present disclosure.
Figure 4B:
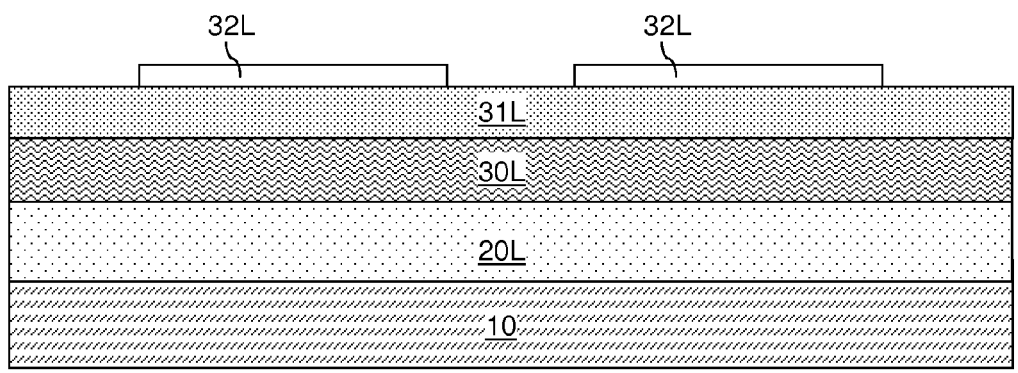
FIG. 4B is a vertical cross-sectional view of the exemplary patterned structure along the vertical plane B-B' of FIG. 4A.

Referring to FIGS. 4A and 4B, the remaining portions of the photoresist layer, i.e., the at least one lithographically exposed photoresist portion 37E, are removed from above the hard mask layer 31L selective to the upper and lower neutral polymer layers (32L, 32U). In one embodiment, the at least one lithographically exposed photoresist portion 37E can be removed by another solvent. In one embodiment, the removal of the remaining portions of the photoresist layer can be performed by dissolving the remaining portions of the photoresist layer in a polar solvent. As used herein, a "polar solvent" refers to a solvent having a dielectric constant greater than 20. In one embodiment, the polar solvent includes tetramethylammonium hydroxide (TMAH). The upper neutral polymer layer 32U can be lifted off, for example, during the removal of the at least one lithographically exposed photoresist portion.

Figure 5A:
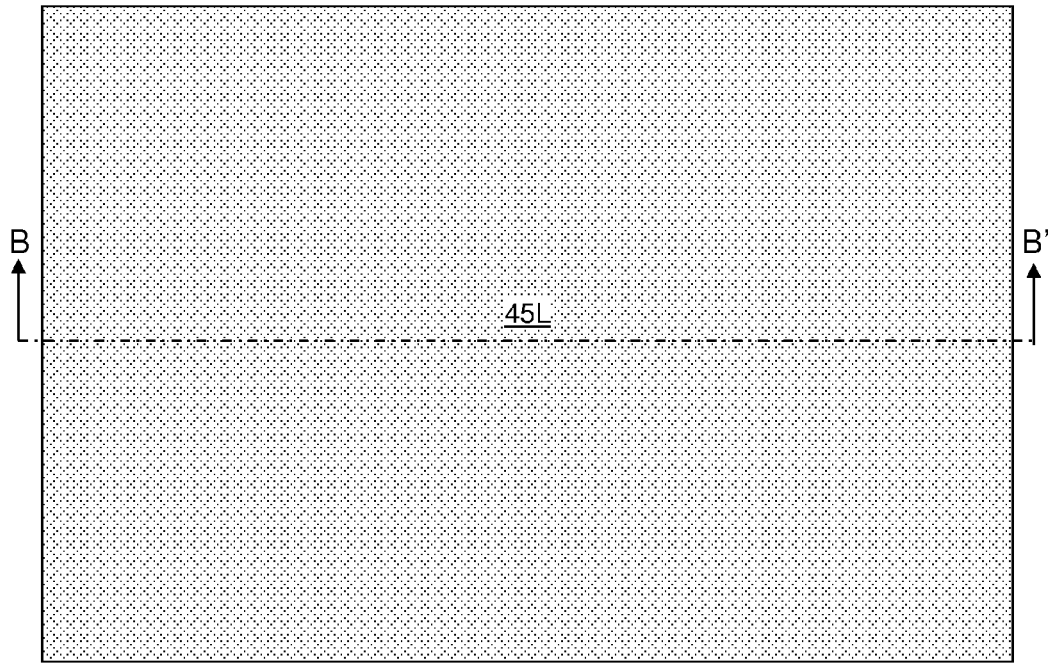
FIG. 5A is a top-down view of the exemplary patterned structure after application of a block copolymer material according to an embodiment of the present disclosure.
Figure 5B:
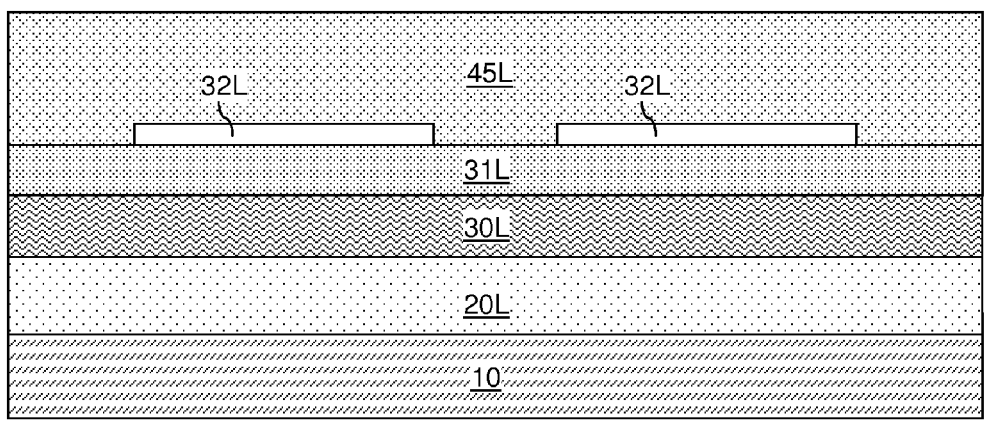
FIG. 5B is a vertical cross-sectional view of the exemplary patterned structure along the vertical plane B-B' of FIG. 5A.

Referring to FIGS. 5A and 5B, a block copolymer material is applied over the top surface of lower neutral polymer layer 32L to form a block copolymer layer 45L. The block copolymer material can be applied, for example, by spin coating. The block copolymer material includes a first polymeric block component and a second polymeric block component that are immiscible with each other. The block copolymer material may be self-planarizing. Alternatively, the block copolymer material may be planarized by chemical mechanical planarization, a recess etch, or a combination thereof. The block copolymer material includes self-assembling block copolymers that are capable of self-organizing into nanometer-scale patterns.

The block copolymer layer 45L can include a first polymer material, i.e., a first polymeric block component, and a second polymer material, i.e., a second polymeric block component. The first polymeric block component and the second polymeric block component are selected such that a self-aligned assembly of first polymer blocks including the first polymeric block component and second polymer blocks including the second polymeric block component can be subsequently formed upon phase separation of the first and second polymeric block components.

Exemplary materials for the first polymeric block component and the second polymeric block component are described in U.S. Pat. No. 7,605,081 to Yang et al., issued on Oct. 20, 2009, the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The self-assembling block copolymers are first dissolved in a suitable solvent system to form a block copolymer solution, which is then applied over the top surface of the lower neutral polymer layer 32L to form the block copolymer layer 45L. The solvent system used for dissolving the block copolymer and forming the block copolymer solution may include any suitable solvent, which can include, but is not limited to: toluene, propylene glycol monomethyl ether acetate (PGMEA), propylene glycol monomethyl ether (PGME), and acetone. The block copolymer material is not a conventional photoresist that may be developed upon exposure to ultraviolet light or optical light. Also, the block copolymer layer 45L is not a conventional low-k dielectric material.

Figure 6A:
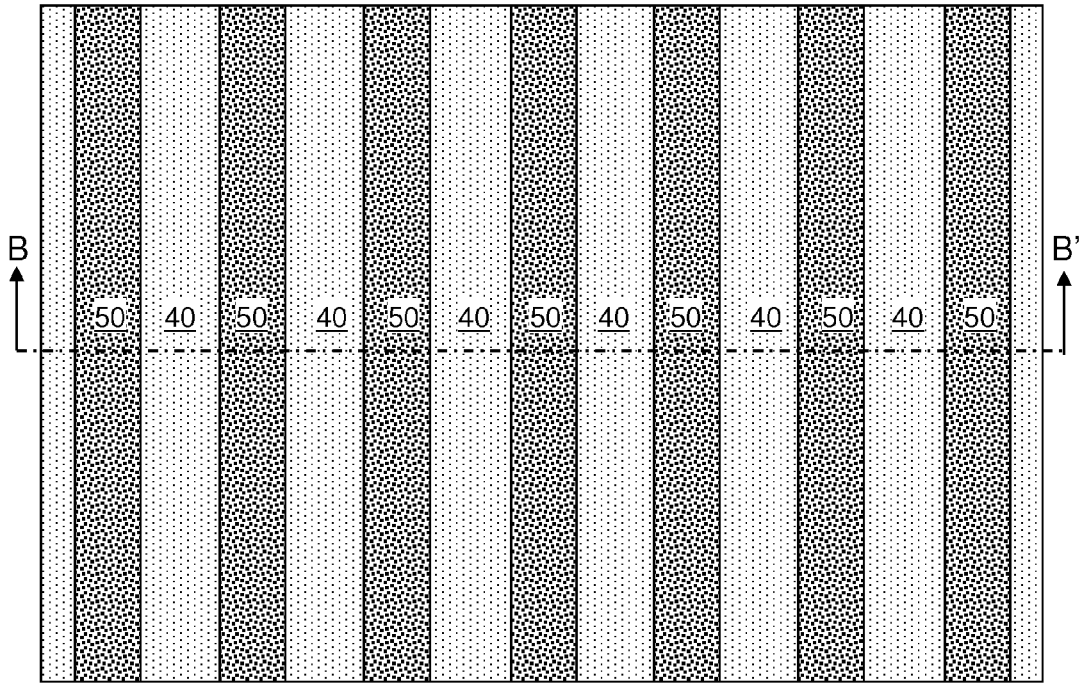
FIG. 6A is a top-down view of the exemplary patterned structure after inducing directed self-assembly of the block copolymer material according to an embodiment of the present disclosure.
Figure 6B:
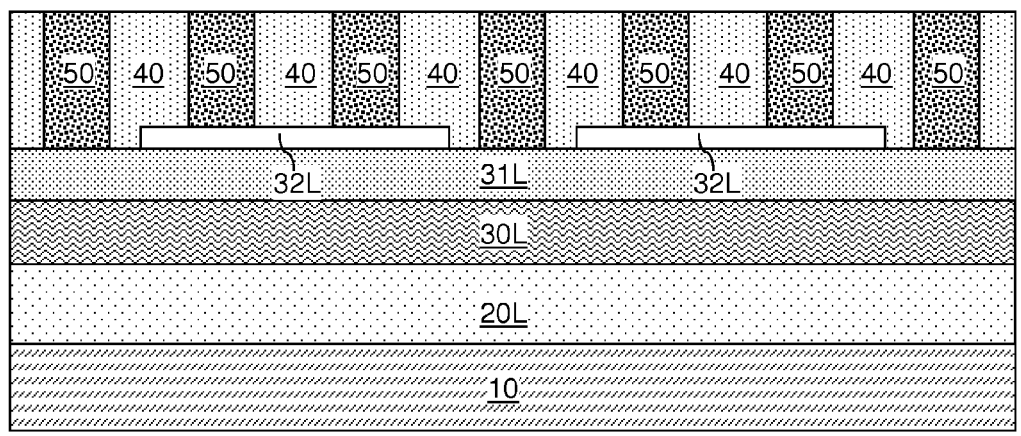
FIG. 6B is a vertical cross-sectional view of the exemplary patterned structure along the vertical plane B-B' of FIG. 6A.

Referring to FIGS. 6A and 6B, directed self-assembly of the block copolymer layer 45L is induced in which the lower neutral polymer layer 32L guides phase separation and alignment of the block copolymer material in the block copolymer layer 45L. The phase separation and alignment of the block copolymer material forms a nanoscale self-assembled self-aligned structure that is self-aligned to the lower neutral polymer layer 32L. The nanoscale self-assembled self-aligned structure is herein referred to as a "self-aligned assembly." The geometrical features of the lower neutral polymer layer 32L controls the orientation of the first polymer blocks 40 and the second polymer blocks 50. In one embodiment, the block copolymer layer 45L is annealed by ultraviolet treatment or by thermal annealing at an elevated temperature to form first polymer blocks 40 including the first polymeric block component and second polymer blocks 50 including the second polymeric block component. The first polymer blocks 40 include regions of the first polymeric block component after self-assembly, and the second polymer blocks 50 include regions of the second polymeric block component after self-assembly. The anneal may be performed, for example, at a temperature from about 200° C. to about 300° C. for a duration from less than about 1 hour to about 100 hours.

The composition and wetting properties of the block copolymer layer 45L can be adjusted such that one of the first polymeric block component and the second polymeric block component has a greater affinity to material of the lower neutral polymer layer 32L. In this case, the first polymer blocks 40 and the second polymer blocks can be aligned to lengthwise sidewalls of the lower neutral polymer layer 32L.

If the lower neutral polymer layer 32L has a rectangular shape in a horizontal cross-sectional view, the first polymer blocks 40 or the second polymer blocks 50 can contact lengthwise sidewalls of the lower neutral polymer layer 32L depending on the affinities of the first polymeric block component and the second polymeric block component. As used herein, "lengthwise sidewalls" refer to a pair of sidewalls that extend along a lengthwise direction of a rectangle. In one embodiment, the self-assembly of the first polymer blocks 40 and the second polymer blocks 50 can form a one-dimensional periodic array of lamellae. In another embodiment, the self-assembly of the first polymer blocks 40 and the second polymer blocks 50 can form an array of embedded cylinders spheres of one of the first and second polymeric block components within a matrix of the other of the first and second polymeric block components.

Alternately, if the lower neutral polymer layer 32L has a non-rectangular shape in a horizontal cross-sectional view, different types of self-assembly structures can be formed that are self-aligned to the lower neutral polymer layer 32L.

Figure 7A:
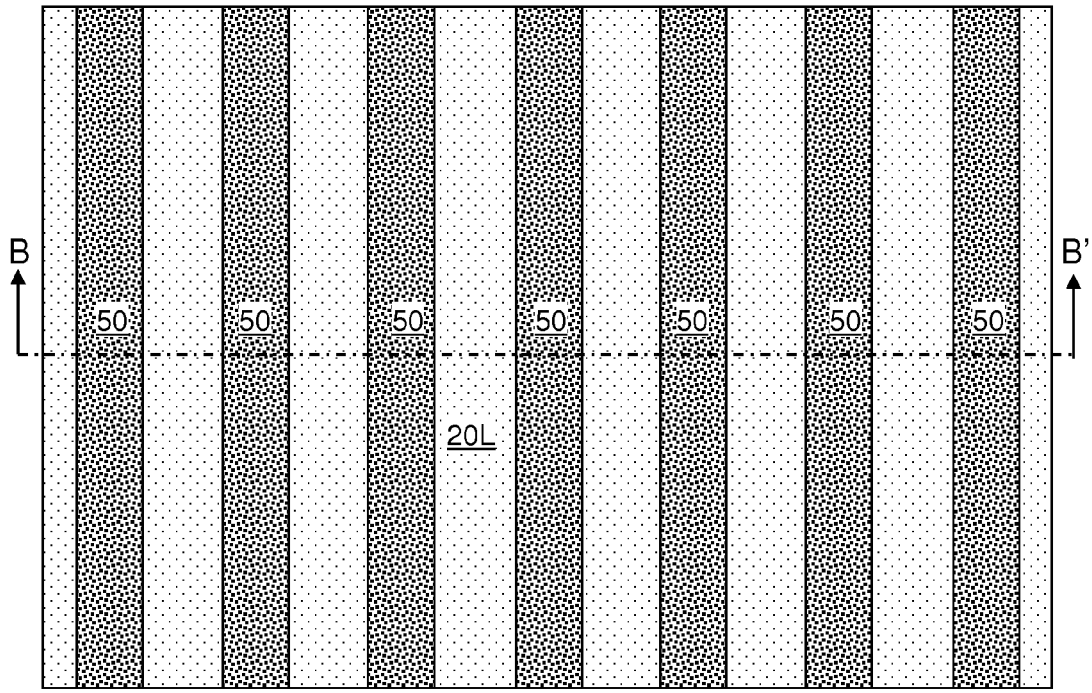
FIG. 7A is a top-down view of the exemplary patterned structure after removal of a first polymeric component selective to a second polymeric component, and transfer of the pattern in the second polymeric component into the hard mask layer and an organic planarization layer (OPL) according to an embodiment of the present disclosure.
Figure 7B:
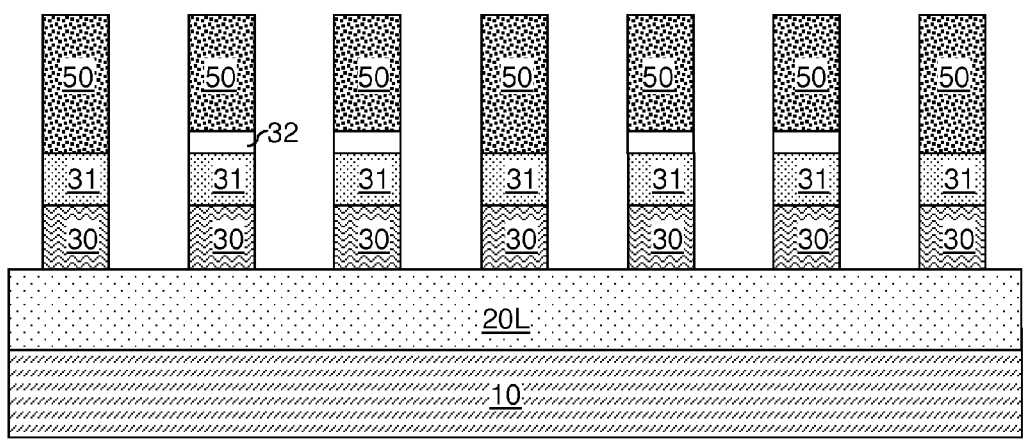
FIG. 7B is a vertical cross-sectional view of the exemplary patterned structure along the vertical plane B-B' of FIG. 7A.

Referring to FIGS. 7A and 7B, the first polymer blocks 40 or the second polymer blocks 50 are removed. In one embodiment, the second polymer blocks 50 can be removed selective to the first polymer blocks 40. In another embodiment, the first polymer blocks 40 can be removed selective to the second polymer blocks 50. The selective removal of one group of polymer blocks, i.e., the first polymer blocks 40 or the second polymer blocks 50, relative to the other group of polymer blocks, i.e., the second polymer blocks 50 or the first polymer blocks 40, can be performed by a wet etch or a dry etch.

A pattern including either the first polymer blocks 40 or the second polymer blocks 50 is formed above the hard mask layer 31L. The pattern is transferred through the lower neutral polymer layer 32L and into the hard mask layer 31L, for example, by an anisotropic etch that employs the remaining polymer blocks, i.e., either the first polymer blocks 40 or the second polymer blocks 50, as an etch mask. Remaining portions of the lower neutral polymer layer 32L are herein referred to as neutral polymer portions 32. Remaining portions of the hard mask layer 31L are herein referred to as hard mask portions 31.

The pattern in the hard mask portions 31 is further transferred into the OPL 30L by another anisotropic etch. In one embodiment, the first polymer blocks 40 or the second polymer blocks 50 that define the pattern may be at least partially present over the hard mask portions 40 during the transfer of the pattern into the OPL 30L. In another embodiment, the first polymer blocks 40 or the second polymer blocks 50 that define the pattern may be removed, for example, by ashing, prior to the transfer of the pattern in the hard mask portions 31 into the OPL 30L. The remaining portions of the OPL 30L are herein referred to as organic planarizing material portions 30.

In one embodiment, the chemistry of the anisotropic etch that removes physically exposed portions of the OPL 30L can be selected so that any remaining material of the first polymer blocks 40 or the second polymer blocks 50 and any remaining material of the lower neutral polymer layer 32 are removed prior to physical exposure of the top surface of the material layer 20L. The hard mask portions 31 can be employed to transfer the pattern into the material layer 20L, i.e., to pattern the material layer 20L with the pattern that is present within the hard mask portions 31.

Figure 8A:
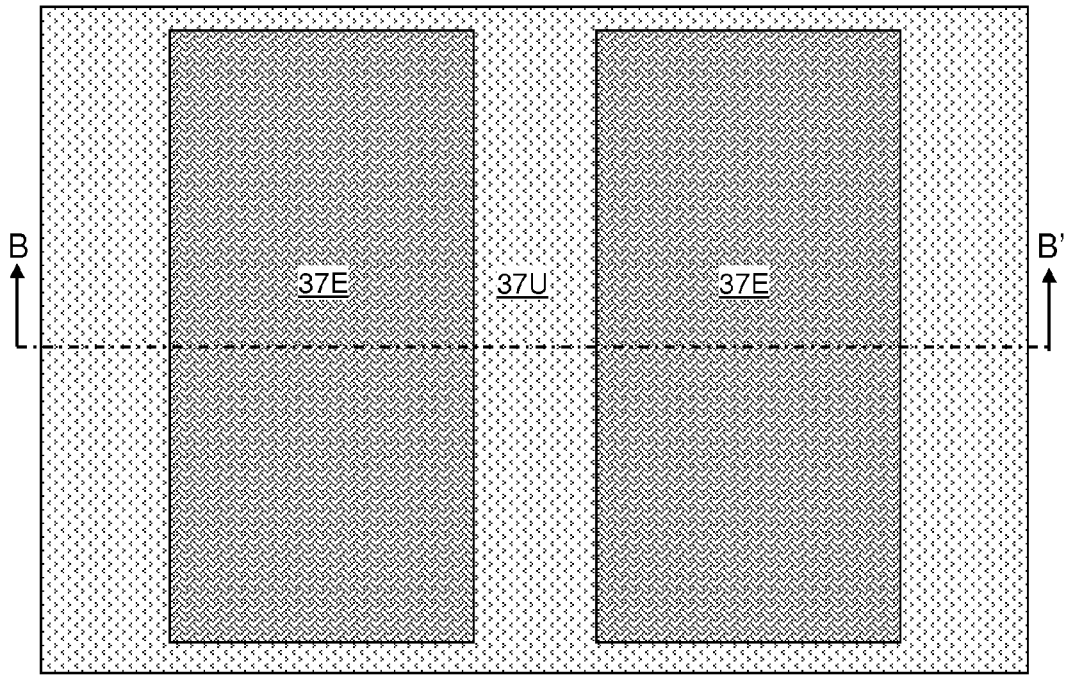
FIG. 8A is a top-down view of a variation of the exemplary patterned structure after lithographic exposure of the photoresist layer including a positive tone photoresist material according to an embodiment of the present disclosure.
Figure 8B:
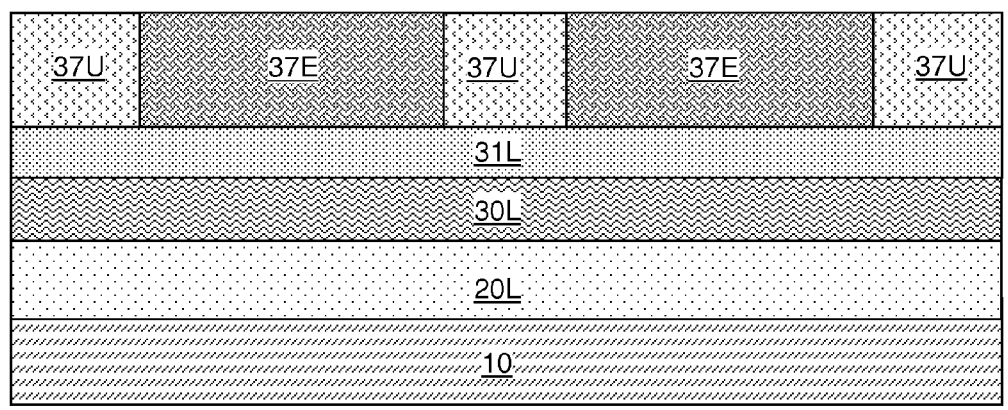
FIG. 8B is a vertical cross-sectional view of the exemplary patterned structure along the vertical plane B-B' of FIG. 8A.

Referring to FIGS. 8A and 8B, a variation of the exemplary patterned structure can be derived from the exemplary structure of FIGS. 1A and 1B by applying a photoresist layer directly on the top surface of the hard mask layer 31L and by lithographically patterning the photoresist layer. In one embodiment, the photoresist layer can include a positive tone photoresist material. The positive tone photoresist material can be selected from materials that dissolve in a non-polar or weakly polar solvent. The thickness of the photoresist layer can be, for example, from 100 nm to 1,000 nm, although lesser and greater thicknesses can also be employed.

The photoresist layer is lithographically exposed to form at least one lithographically exposed photoresist portion 37E and at least one lithographically unexposed photoresist portion 37U therein. The area of the at least one lithographically unexposed photoresist portion 37E can be selected to coincide with the area in which a neutral polymer layer is to be subsequently formed. The neutral polymer layer is used to control the orientation of phase-separated self-assembling block copolymers. In one embodiment, the at least one lithographically exposed photoresist portion 37E can have a polygonal shape. In one embodiment, the at least one lithographically unexposed photoresist portion 37E can have a rectangular shape.

Figure 9A:
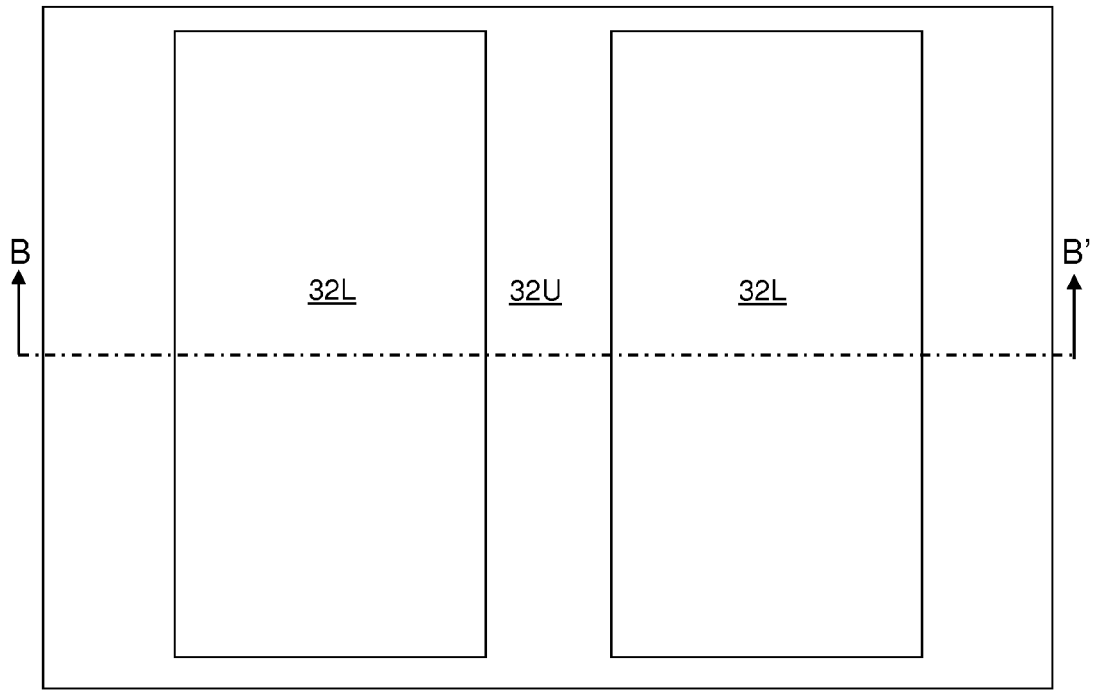
FIG. 9A is a top-down view of the variation of the exemplary patterned structure after development of the photoresist layer and simultaneous formation of a neutral polymer layer according to an embodiment of the present disclosure.
Figure 9B:
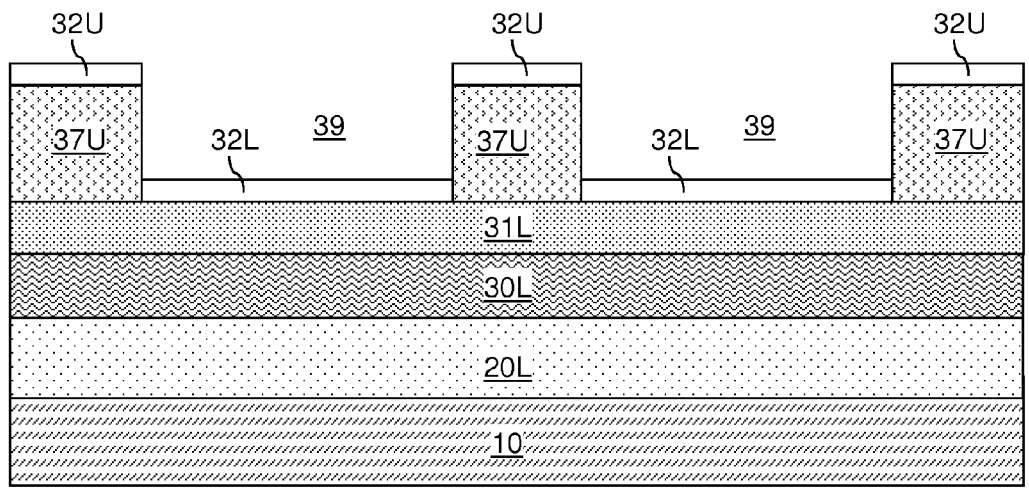
FIG. 9B is a vertical cross-sectional view of the exemplary patterned structure along the vertical plane B-B' of FIG. 9A.

Referring to FIGS. 9A and 9B, a lithographic development of the photoresist layer and formation of a neutral polymer layer can be simultaneously performed. If the photoresist layer includes a positive tone photoresist material, the simultaneous lithographic development of the photoresist layer and formation of the neutral polymer layer can be formed, for example, employing a non-polar solvent or a weakly polar solvent. A random polymer material is dissolved in the non-polar solvent or the weakly polar solvent prior to use for development of the photoresist layer. Subsequently, the non-polar or weakly polar solvent including the random polymer material is applied to the photoresist layer for development of the photoresist layer. The non-polar or weakly polar solvent dissolves the at least one lithographically exposed photoresist portion 37E selective to the at least one lithographically unexposed photoresist portion 37U.

For example, the non-polar or weakly polar solvent can be a weakly polar solvent including isopropanol (having a dielectric constant of 18.2). The neutral polymer material dissolved in the non-polar or weakly polar solvent includes a random polymer material in which at least two types of monomers are polymerized in a random sequence. In one embodiment, the random polymer material can include random sequences of styrene and methyl methacrylate. In addition, the neutral polymer material may include a functional group that binds to the material of the hard mask layer 31L.

Upon removal of the at least one lithographically exposed photoresist portion 37E from above the hard mask layer 31L, at least one trench 39 is formed in volumes from which the at least one lithographically exposed photoresist portion 37E is removed. A lower neutral polymer layer 32L including the neutral polymer material is formed on each physically exposed surface of the hard mask layer 31L at the bottom of each trench 39. The thickness of the lower neutral polymer layer 32L can be, for example, from 1 nm to 5 nm. The at least one lithographically unexposed photoresist portion 37U remains on the hard mask layer 31L. An upper neutral polymer layer 32U including the neutral polymer material may be formed on the physically exposed horizontal surfaces of the at least one lithographically unexposed photoresist portion 37U. The thickness of the upper neutral polymer layer 32U can be, for example, from 1 nm to 5 nm. The sidewalls of the at least one lithographically unexposed photoresist portion 37U are not typically covered by a neutral polymer layer because the neutral polymer material tends to flow down the sidewalls of the at least one lithographically unexposed photoresist portion 37U before volatile components of the non-polar or weakly polar solvent evaporates.

Optionally, a bake process may be performed on the exemplary structure in order to drive out volatile components of the solvent from the lower neutral polymer layer 32L and the upper neutral polymer layer 32U. In this case, the remaining portions of the photoresist layer, i.e., the at least one lithographically unexposed photoresist portion 37U, and the lower neutral polymer layer 32L and the upper neutral polymer layer 32U are simultaneously baked. The bake process can be performed at an elevated temperature, which can be in a range from 80 C to 200 C, although lesser and greater temperatures can also be employed.

Optionally, an additional neutral polymer material can be added to the lower and/or upper neutral polymer layers (32L, 32U). The additional neutral polymer material can be added, for example, by spin coating of the same random polymer material present in the lower and/or upper neutral polymer layers (32L, 32U) prior to application of the additional neutral polymer, or may be added by spin coating of a different random polymer material. In this case, the bake process may be performed prior to the application of the additional neutral polymer layer. The thicknesses of the lower and/or upper neutral polymer layers (32L, 32U) may be in a range from 1.5 nm to 5 nm, although lesser and greater thicknesses can also be employed.

Subsequently, the remaining portions of the photoresist layer, i.e., the at least one lithographically unexposed photoresist portion 37U, are removed from above the hard mask layer 31L selective to the upper and lower neutral polymer layers (32L, 32U). In one embodiment, the at least one lithographically unexposed photoresist portion 37U can be removed by another solvent. In one embodiment, the removal of the remaining portions of the photoresist layer can be performed by dissolving the remaining portions of the photoresist layer in a polar solvent. In one embodiment, the polar solvent includes tetramethylammonium hydroxide (TMAH). The upper neutral polymer layer 32U can be lifted off, for example, during the removal of the at least one lithographically exposed photoresist portion.

Subsequently, the processing steps of FIGS. 5A, 5B, 6A, 6B, 7A, and 7B are performed to provide the exemplary structure illustrated in FIGS. 7A and 7B.

The methods of the present disclosure simplifies a processing sequence for formation of a self-assembled structure employing a block copolymer material by simultaneously forming a neutral polymer layer at the time of development of a positive photoresist or a negative photoresist. By dissolving a neutral polymer layer in a non-polar or weakly polar solvent, the neutral polymer layer is formed on physically exposed surfaces of a hard mask layer, thereby enabling omission of a separate processing step required in conventional processing sequences for forming self-assembled structures.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a patterned structure comprising:
   forming a photoresist layer on a hard mask layer;
   lithographically exposing said photoresist layer to form at least one lithographically exposed photoresist portion and at least one lithographically unexposed photoresist portion therein;
   developing said photoresist layer with a solvent including a dissolved neutral polymer material, wherein said at least one lithographically exposed photoresist portion or said at least one lithographically unexposed photoresist portion is removed from above said hard mask layer, and wherein a neutral polymer layer comprising said neutral polymer material is formed on physically exposed surfaces of said hard mask layer; and
   removing remaining portions of said photoresist layer from above said hard mask layer selective to said neutral polymer layer.

2. The method of claim 1, further comprising:
   applying a block copolymer material over said neutral polymer and said hard mask layer; and
   inducing directed self-assembly of said block copolymer layer, wherein said neutral polymer layer guides phase separation and alignment of said block copolymer material.

3. The method of claim 2, wherein said block copolymer material including a first polymeric block component and a second polymeric block component that are immiscible with each other.

4. The method of claim 1, wherein said removing of said remaining portions of said photoresist layer is performed by dissolving said remaining portions of said photoresist layer in a polar solvent.

5. The method of claim 4, wherein said polar solvent comprises tetramethylammonium hydroxide (TMAH).

6. The method of claim 1, further comprising adding an additional neutral polymer material to said neutral polymer layer prior to said removing of said remaining portions of said photoresist layer.

7. The method of claim 6, further comprising baking said remaining portions of said photoresist layer prior to said adding of said additional neutral polymer material.

8. The method of claim 1, wherein said neutral polymer material comprises a random polymer material in which at least two types of monomers are polymerized in a random sequence.

9. The method of claim 8, wherein said at least two types of monomers comprises styrene and methyl methacrylate.

10. The method of claim 1, wherein said neutral polymer layer is formed with a thickness in a range from 1 nm to 5 nm.

11. The method of claim 1, wherein said solvent is a non-polar solvent having a dielectric constant less than 15.

12. The method of claim 11, wherein said non-polar solvent comprises at least one material selected from anisole, 2-heptanone, and n-butylacetate.

13. The method of claim 11 wherein said photoresist layer comprises a negative tone photoresist material, and said remaining portions of said photoresist layer is said at least one lithographically exposed photoresist portion.

14. The method of claim 1, wherein said solvent is a weakly polar solvent having a dielectric constant not less than 15 and not greater than 20.

15. The method of claim 14, wherein said weakly polar solvent comprises isopropanol.

16. The method of claim 14, wherein said photoresist layer comprises a positive tone photoresist material, and said remaining portions of said photoresist layer is said at least one lithographically unexposed photoresist portion.

17. The method of claim 1, further comprising dissolving said neutral polymer material in said solvent prior to application of said solvent to said photoresist layer for development of said photoresist layer.

18. The method of claim 1, further comprising:
  forming an optically planarizing layer (OPL) over a substrate; and
  forming said hard mask layer on said OPL, wherein said photoresist layer is formed directly on said hard mask layer.

19. The method of claim 18, wherein said OPL comprises amorphous carbon or a self-planarizing organic material including at least C, O, and H.

20. The method of claim 1, wherein said hard mask layer comprises silicon oxide, silicon nitride, silicon oxynitride, or a silicon-based anti-reflective coating (ARC).

\* \* \* \* \*